(12) United States Patent
Haba et al.

(10) Patent No.: US 9,406,532 B2
(45) Date of Patent: Aug. 2, 2016

(54) INTERPOSER HAVING MOLDED LOW CTE DIELECTRIC

(71) Applicant: Tessera, Inc., San Jose, CA (US)

(72) Inventors: Belgacem Haba, Saratoga, CA (US); Ilyas Mohammed, Santa Clara, CA (US)

(73) Assignee: Tessera, Inc., San Jose, CA (US)

( * ) Notice: Subject to any disclaimer, the term of this patent is extended or adjusted under 35 U.S.C. 154(b) by 0 days.

(21) Appl. No.: 14/221,486

(22) Filed: Mar. 21, 2014

(65) Prior Publication Data

US 2014/0206184 A1    Jul. 24, 2014

Related U.S. Application Data

(62) Division of application No. 13/091,800, filed on Apr. 21, 2011, now Pat. No. 8,709,933.

(51) Int. Cl.
*H01L 21/44* (2006.01)
*H01L 21/48* (2006.01)
(Continued)

(52) U.S. Cl.
CPC ........ *H01L 21/486* (2013.01); *H01L 23/49827* (2013.01); *H05K 3/4046* (2013.01);
(Continued)

(58) Field of Classification Search
CPC ............ H01L 21/486; H01L 23/49861; H01L 2924/09701; H01L 23/49827; H01L 23/49894; H01L 2924/15311; H01L 2224/16225; H01L 23/482; H01L 27/02; H01L 21/28; H05K 3/4046; H05K 2201/0979; H05K 2201/10674; H05K 2201/10378
See application file for complete search history.

(56) References Cited

U.S. PATENT DOCUMENTS 5,454,161 A * 10/1995 Beilin et al. .................... 29/852
5,455,390 A    10/1995 DiStefano et al.
(Continued)

FOREIGN PATENT DOCUMENTS

CN    1292635 A    4/2001
EP    1093329 A2   4/2001
(Continued)

OTHER PUBLICATIONS

International Search Report dated Jul. 20, 2012 for Application No. PCT/US2012/034209.
(Continued)

*Primary Examiner* — Charles Garber
*Assistant Examiner* — Abdulfattah Mustapha
(74) *Attorney, Agent, or Firm* — Lerner, David, Littenberg, Krumholz & Mentlik, LLP

(57) ABSTRACT

A method for making an interconnection component is disclosed, including forming a plurality of metal posts extending away from a reference surface. Each post is formed having a pair of opposed end surface and an edge surface extending therebetween. A dielectric layer is formed contacting the edge surfaces and filling spaces between adjacent ones of the posts. The dielectric layer has first and second opposed surfaces adjacent the first and second end surfaces. The dielectric layer has a coefficient of thermal expansion of less than 8 ppm/° C. The interconnection component is completed such that it has no interconnects between the first and second end surfaces of the posts that extend in a lateral direction. First and second pluralities of wettable contacts are adjacent the first and second opposed surfaces. The wettable contacts are usable to bond the interconnection component to a microelectronic element or a circuit panel.

20 Claims, 8 Drawing Sheets

(51) Int. Cl.
*H01L 23/498* (2006.01)
*H05K 3/40* (2006.01)

(52) U.S. Cl.
CPC ..... *H01L23/49861* (2013.01); *H01L 23/49894* (2013.01); *H01L 2224/16225* (2013.01); *H01L 2924/09701* (2013.01); *H01L 2924/15311* (2013.01); *H05K 2201/0979* (2013.01); *H05K 2201/10378* (2013.01); *H05K 2201/10674* (2013.01)

(56) References Cited

U.S. PATENT DOCUMENTS

| | | | |
|---|---|---|---|
| 5,629,241 | A | 5/1997 | Matloubian et al. |
| 7,759,782 | B2 | 7/2010 | Haba et al. |
| 8,482,111 | B2 | 7/2013 | Haba |
| 2003/0151067 | A1 | 8/2003 | Iijima et al. |
| 2008/0003402 | A1 | 1/2008 | Haba et al. |
| 2008/0108178 | A1 | 5/2008 | Wilson et al. |
| 2010/0273293 | A1 | 10/2010 | Haba et al. |
| 2011/0062549 | A1 | 3/2011 | Lin |
| 2011/0155433 | A1* | 6/2011 | Funaya et al. ............... 174/258 |
| 2012/0139082 | A1* | 6/2012 | Oganesian et al. ........... 257/531 |
| 2013/0313012 | A1 | 11/2013 | Yang et al. |

FOREIGN PATENT DOCUMENTS

| | | |
|---|---|---|
| KR | 20010094893 A | 11/2001 |
| TW | 512467 B | 12/2002 |
| TW | 200512843 A | 4/2005 |

OTHER PUBLICATIONS

Taiwanese Office Action for Application No. 101114254 dated Nov. 6, 2013.

Chinese Office Action for Application No. 201280030721.6 dated Oct. 8, 2014.

* cited by examiner

INTERPOSER HAVING MOLDED LOW CTE DIELECTRIC

CROSS-REFERENCE TO RELATED APPLICATIONS

The present application is a divisional of U.S. patent application Ser. No. 13/091,800, filed Apr. 21, 2011, the disclosure of which is incorporated herein by reference.

BACKGROUND OF THE INVENTION

Interconnection components, such as interposers are used in electronic assemblies to facilitate connection between components with different connection configurations or to provide needed spacing between components in a microelectronic assembly. Interposers can include a dielectric element in the form of a sheet or layer of dielectric material having numerous conductive traces extending on or within the sheet or layer. The traces can be provided in one level or in multiple levels throughout a single dielectric layer, separated by portions of dielectric material within the layer. The interposer can also include conductive elements such as conductive vias extending through the layer of dielectric material to interconnect traces in different levels. Some interposers are used as components of microelectronic assemblies. Microelectronic assemblies generally include one or more packaged microelectronic elements such as one or more semiconductor chips mounted on a substrate. The conductive elements of the interposer can include the conductive traces and terminals that can be used for making electrical connection with a larger substrate or circuit panel in the form of a printed circuit board ("PCB") or the like. This arrangement facilitates electrical connections needed to achieve desired functionality of the devices. The chip can be electrically connected to the traces and hence to the terminals, so that the package can be mounted to a larger circuit panel by bonding the terminals of the circuit panel to contact pads on the interposer. For example, some interposers used in microelectronic packaging have terminals in the form of exposed ends of pins or posts extending through the dielectric layer. In other applications, the terminals of an interposer can be exposed pads or portions of traces formed on a redistribution layer.

Despite considerable efforts devoted in the art heretofore to development of interposers and methods for fabricating such components, further improvement is desirable.

SUMMARY OF THE INVENTION

An embodiment of the present disclosure relates to a method for making an interconnection component. The method includes forming a plurality of substantially rigid solid metal posts extending away from a reference surface. Each post is formed having a first and a second opposed end surface and an edge surface extending between the first and second end surfaces. Then a dielectric layer is formed contacting the edge surfaces and filling spaces between adjacent ones of the posts. The dielectric layer has first and second opposed surfaces adjacent the first and second end surfaces. The dielectric layer material has a coefficient of thermal expansion of less than 8 parts per million per degree Celsius (ppm/° C.). The method also includes completing the interconnection component such that the interconnection component has no interconnects between the first and second end surfaces of the posts that extend in a lateral direction. The interconnection component is further completed such that it has first and second pluralities of wettable contacts adjacent the first and second opposed surfaces, respectively. The first and second wettable contacts are usable to bond the interconnection component to at least one of a microelectronic element and a circuit panel. At least one of the first wettable contacts or the second wettable contacts matches a spatial distribution of element contacts at a face of a microelectronic element and at least one of the first wettable contacts or the second wettable contacts matches a spatial distribution of circuit contacts exposed at a face of a circuit panel.

The plurality of posts can be formed such that at least some of the wettable contacts are defined by the first end surfaces or the second end surfaces. In an embodiment, at least some of the second wettable contacts can be on either the first or second surface of the dielectric layer and can be connected with the second end surfaces. Such wettable contacts can be offset along the second surface of the dielectric layer from the connected second end surfaces. In such an embodiment, the wettable contacts can define a first pitch and the second wettable contacts can define a second pitch that is different from the first pitch.

In a variation of the embodiment, the dielectric layer can be a first dielectric layer, and the method can further include forming a second dielectric layer along, for example, the second surface of the first dielectric layer. The second dielectric layer can have an outside surface along which at least some of the second wettable contacts are, and the wettable contacts can be connected with the second end surfaces by traces formed along the second dielectric layer. The method can further include forming a third dielectric layer along the other surface of the first dielectric layer. The third dielectric layer can have an outside surface along which at least some of the other wettable contacts are, and the wettable contacts can be connected with the respective end surfaces by second traces formed along the second dielectric layer.

The step of forming the dielectric layer can include removing a portion of the dielectric layer to uncover at least one of the first end surfaces or second end surfaces of the posts. The first dielectric layer can be formed from a material such as: low temperature co-fired ceramic, liquid crystal polymer, glass or high filler content epoxy, among others. The first dielectric layer can be formed to have a thickness of at least 10 μm between the first and second surfaces.

The plurality of posts can be formed from materials such as: gold, copper, copper alloy, aluminum, or nickel. Further, the posts can be formed on a rigid metal layer that defines the reference surface, and the step of completing the interconnection component can further include selectively removing portions of the rigid metal layer to form a plurality of traces connected to at least some of the first plurality of wettable contacts. The posts can be formed on the rigid metal layer by plating the posts along selected areas of the rigid metal layer. Alternatively, the posts and the rigid metal layer can be formed by etching a solid metal layer to remove metal from areas outside the posts so as to leave a portion of the solid metal layer to form the rigid metal layer with the posts extending therefrom. Such a step can further including removing selected portions of the rigid metal layer to form traces extending between at least some of the first end surfaces.

The reference surface can be defined by an inside surface of a redistribution layer, and the redistribution layer can have an outside surface along which at least some of the first wettable contacts are formed. The first wettable contacts can be connected to the second end surfaces by first traces formed within the redistribution layer.

Another embodiment of the present disclosure relates to a method for making a microelectronic assembly. The method can include mounting an interconnection component made according to the previous embodiment to a substrate having a plurality of first contact pads formed thereon such that at least some of the first wettable contacts are electrically connected to the first contact pads. The method can further include mounting a microelectronic element having a plurality of second contact pads formed thereon to the interconnect structure such that at least some of the second contact pads are electrically connected to the second wettable contacts of the interconnect structure.

A further embodiment of the present disclosure relates to a method for making an interconnection component. The method includes forming a redistribution layer on a carrier, the redistribution layer including a redistribution dielectric having a first surface on the carrier and a second surface remote therefrom. A plurality of first contact pads can be uncovered by the substrate at the first surface thereof. A plurality of traces have portions thereof embedded within the substrate and further have portions thereof uncovered by the substrate at the second surface thereof. The method further includes forming a plurality of substantially rigid solid metal posts extending away from the redistribution layer. Each of the conductive elements include a base electrically joined to a trace of the redistribution layer, an end surface remote from the base, and an edge surface extending between the base and the end surface. A dielectric material layer is then deposited along portions of the second surface and the traces not covered by the posts and extending along the edge surfaces of the posts to an outside surface remote from the redistribution layer. The method is carried out such that the end surfaces of the posts are uncovered by the dielectric material layer and such that there are no interconnects between the first and second end surfaces of the posts that extend in a lateral direction.

Another embodiment of the present disclosure relates to an interconnection component. The interconnection component includes a plurality of substantially rigid solid metal posts, each having a first end surface, a second end surface remote from the first end surface, and an edge surface extending between the first and second end surfaces. Each post extends in a direction normal to the end surfaces, and each post is a single monolithic metal region throughout and at the edge surface thereof. The component also includes a dielectric layer having a coefficient of thermal expansion of less than 8 parts per million per degree Celsius (ppm/° C.) directly contacting the edge surfaces and filling spaces between adjacent ones of the posts. The dielectric layer has first and second opposed surfaces adjacent the first and second end surfaces, the first and second surfaces extending in lateral directions. The interconnection component has no interconnects between the first and second end surfaces of the posts that extend in a lateral direction. The interconnection component has first and second pluralities of wettable contacts adjacent the first and second opposed surfaces, respectively. The first and second wettable contacts are usable to bond the interconnection component to at least one of a microelectronic element and a circuit panel. At least one of the first wettable contacts or the second wettable contacts matches a spatial distribution of element contacts at a face of a microelectronic element and at least one of the first wettable contacts or the second wettable contacts matches a spatial distribution of circuit contacts exposed at a face of a circuit panel.

At least some of the wettable contacts can be defined by the first end surfaces or the second end surfaces. The posts can be made from copper. The substantially rigid solid metal posts can, also be made from gold, aluminum, or nickel. At least one of the posts can include a first end region adjacent the first end surface and a second end region adjacent the second end surface. Further, the at least one post can have an axis and a circumferential surface which slopes toward or away from the axis in the vertical direction along the axis such that the slope of the circumferential wall changes abruptly at a boundary between the first end region and the second end region. Further, the posts can form surfaces of revolution around an axis extending between the first and second end surfaces. In an example, at least some of the surfaces of revolution can be truncated cones. Alternatively, at least some of the surfaces of revolution can be parabolic along a portion thereof.

The first dielectric layer can be made of a material such as: low temperature co-fired ceramic, liquid crystal polymer, glass, and high filler-content epoxy. The first dielectric layer can have a thickness of at least 10 μm between the first and second surfaces. The thickness can further be between about 30 μm and 70 μm.

At least some of the first wettable contacts can be connected with the first end surfaces and are offset along the first surface of the dielectric layer from the connected first end surfaces. At least some of the second wettable contacts can be connected to the second end surfaces and can be offset along the second surface of the dielectric layer from the connected second end surfaces. The interconnection component can further include a plurality of first traces on the first surface of the first dielectric layer that are connected to at least some of the first ends of the posts.

The dielectric layer can be a first dielectric layer, and the first wettable contacts can be exposed on an outside surface of a second dielectric layer disposed along the first surface of the first dielectric layer and can be connected with the first end surfaces by first conductive traces embedded in the second dielectric layer. At least some of the second wettable contacts can be offset along the first surface of the second dielectric layer from the connected second end surfaces, and the second wettable contacts can be exposed on an outside surface of a third dielectric layer disposed along the second surface of the first dielectric layer. The second wettable contacts can be connected with the second end surfaces by second conductive traces embedded in the third dielectric layer.

The first wettable contacts can define a first pitch and the second wettable contacts can define a second pitch that is smaller than the first pitch. In one variation, the second pitch can be up to 50% of the first pitch.

In a further embodiment of the present disclosure, a microelectronic assembly can include a microelectronic element having element contacts. The assembly can further include an interconnection component according one of the previously-described embodiments and a circuit having circuit contacts thereon. At least some of the first contact pads of the microelectronic element are bonded to the first wettable contacts of the posts of the interconnection component, and the second wettable contacts are bonded to the circuit contacts.

BRIEF DESCRIPTION OF THE DRAWINGS

Various embodiments of the present invention will be now described with reference to the appended drawings. It is appreciated that these drawings depict only some embodiments of the invention and are therefore not to be considered limiting of its scope.

Herein, identical reference numerals are used, where possible, to designate identical elements that are common to the figures. The images in the drawings are simplified for illustrative purposes and are not depicted to scale.

Figure 1:
FIG. 1 is a top view of a structure that can be used to form part of an interconnection device according to an embodiment of the present disclosure.

The appended drawings illustrate exemplary embodiments of the invention and, as such, should not be considered as limiting the scope of the invention that may admit to other equally effective embodiments.

DETAILED DESCRIPTION

FIGS. 4-7 show an interconnection component 2, during stages of a method for fabrication thereof. The interconnection component 2 is shown in a completed form in FIG. 8 having a plurality of posts 10 within a dielectric layer 20. Posts 10 have end surfaces 10A and 10B remote from each other with an edge surface 14 extending therebetween. End surfaces 10A and 10B are left uncovered by the dielectric layer 20 on corresponding surfaces 228 and 226 thereof. Widths of the end surfaces 10A, and 10B are generally selected in a range from about 50 to 1000 μm, for example, 200-300 μm. The posts 10 can also be in the form of conductive pins.

The posts 10 can be formed at locations facilitating connectivity between elements of a microelectronic assembly. Such posts may have different form factors and be organized, for example, in one or more grid-like patterns having a pitch in a range from 100 to 10000 μm (e.g., 400-650 μm).

Figure 13:
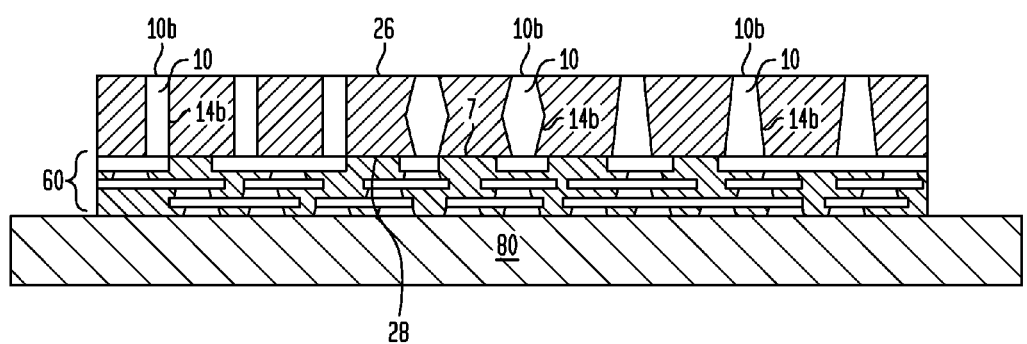

Dielectric layer 20 extends at least partially over surface 7, which in FIG. 13 is defined by portions of traces 30 and portions of redistribution dielectric 62. Dielectric layer 20 can be formed from, for example, compositions which cure by chemical reaction to form a polymeric dielectric, such as epoxies and polyimides may be used. In other cases, the flowable composition can be a thermoplastic at an elevated temperature, which can harden to a solid condition by cooling. Preferably, dielectric layer 20 forms binding interfaces with features of the component 2, including, for example, posts 10 and traces 30. The material used for dielectric layer 20 can further include one or more additives influencing properties of dielectric layer 20. For example, such additives can include particulate materials such as silica or other inorganic dielectrics, or fibrous reinforcements such as short glass fibers.

Figure 10A:
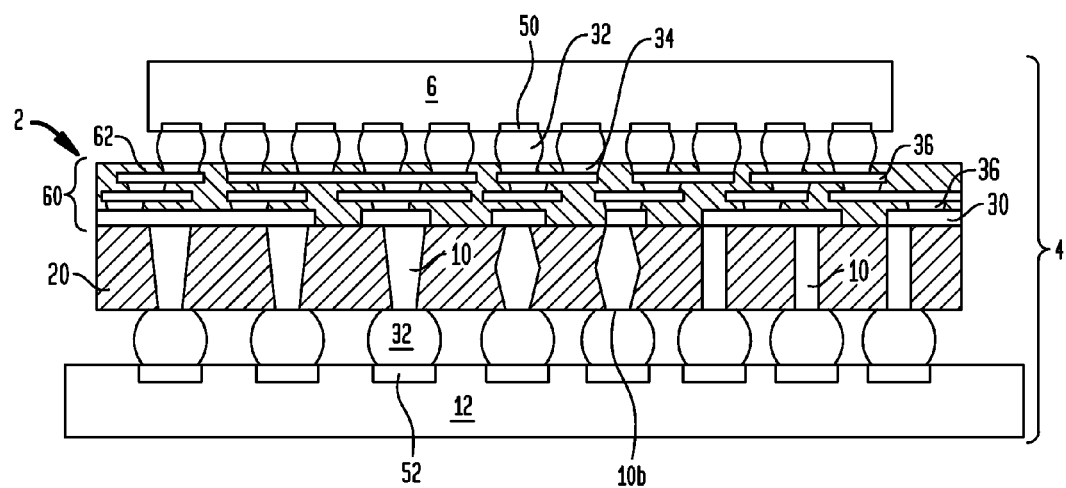
FIGS. 10A and 10B show variations of a microelectronic assembly respectively including interconnection components according to the embodiments of FIGS. 8 and 9A.
Figure 10B:
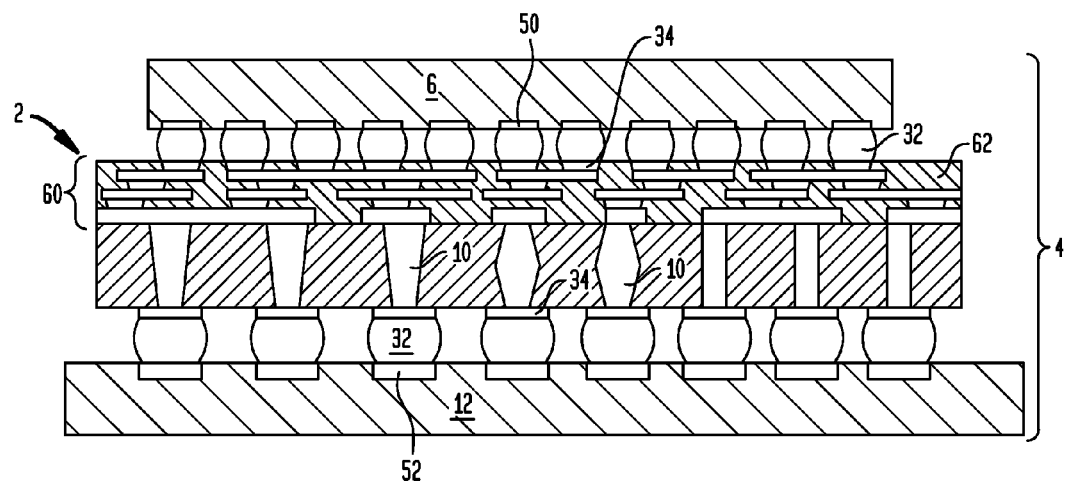

Interconnection component 2 can include a dielectric layer 20 that is made from a material having a low coefficient of thermal expansion ("CTE"). The CTE of the material used to form dielectric layer 20 can be in the range of 8 parts per million per degree Celsius ("ppm/° C.") or lower. Components such as the interconnection component described herein may be subject to frequent high temperatures and cycling between high and low temperatures during manufacture, testing, or use. In application, as shown in FIGS. 10A and 10B, one or more microelectronic elements having fine-pitch bonding interfaces can be flip-chip bonded to an interconnection component 2 having a lower CTE dielectric layer 20. Because the difference in the CTE between the interconnection component and, for example, the microelectronic element 6 can be reduced to a more manageable quantity. In such cases, reduced stress at the bonding interface can permit reductions in solder bump sizes at the bonding interface to help achieve finer pitch.

Moreover, when structures within an interconnection component have differing CTEs, the different amounts by which they expand and contract due to changing temperatures can apply stresses between the dielectric layer 220 and posts 210 which can lead to delamination or cracking under certain conditions. Accordingly, a component having such a dielectric material layer can be less likely than components having higher CTEs to have pins 210 become detached from within the molded dielectric layer 220 during use. By forming dielectric layer 20 with a low-CTE, or one that is closer to that of the conductive material used to form pins 10, the structures will expand and contract by closer amounts, thereby potentially reducing the likelihood of bonding interface failures. Dielectric materials that can be used to form a molded dielectric layer 20 in a substrate or interconnect component as described herein can include various low-temperature co-fired ceramics, various liquid-crystal polymers ("LCP"), and glass. Certain composite materials having an epoxy matrix can also exhibit an appropriately-low CTE. Such materials include high filler content epoxy composites, wherein the filler is formed from glass or other similar materials.

As shown in the figures, interconnection component 2 is free from any electrically conductive interconnects running between the posts 10 or elsewhere in an at least partially lateral direction (parallel to the surfaces 26,28 of dielectric layer 20) within the dielectric material between the end surfaces 10A and 10B. Traces 30 or the like can be used to form connections running in a lateral direction outside of the area between end surfaces 10A and 10B. In an example, there are no lateral connections within dielectric layer 20. In another example, within dielectric layer 20 the only connections formed are by posts 10 between the surfaces, 26 and 28, of dielectric layer 20.

Figure 8:
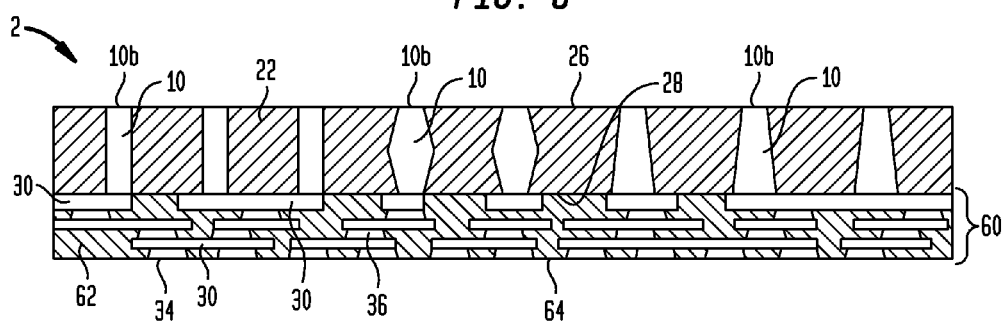
FIG. 8 shows an interconnection component according to an embodiment of the present disclosure.
Figure 9A:
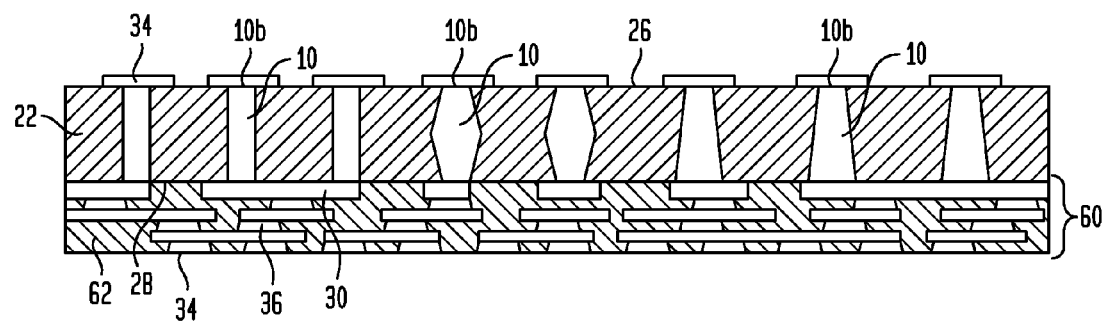
FIGS. 9A and 9B show alternative embodiments of an interconnection component that include additions to the embodiment of FIG. 8.

In the interconnection component of FIG. 8 end surfaces 10B can be wettable contacts used to connect posts 10 to another component using solder balls or other conductive materials. For example, in FIG. 10A, end surfaces 10B are used to join posts 10 to solder balls 32, which are, in turn, joined to contacts 50 on a microelectronic element 6. Other materials can be used in place of solder balls 32 to join features of the components of the assembly such as tin indium or a conductive matrix. Additional, wettable metal layers or structures can be added to interconnection component 2 that can be wettable contacts for connection to other microelectronic components. Such wettable metal layers or structures can be made from nickel or Ni—Au, or organic solderable preservative ("OSP"). Structures that can be wettable contacts include portions of traces 30 or contact pads 34 that can be patterned with traces 30 or can overlie traces 30 or end surfaces 10A,10B. FIG. 9A, for example shows pads 34 that can be wettable contacts on surface 26 of dielectric layer 20 that overlie ends 10B of posts 10 and are electrically connected therewith.

As further shown in FIG. 8, wettable contacts can be provided as pads 34 electrically interconnected with end surfaces 10A through traces 30 and other electrically conductive structure, e.g., conductive vias 36. In one example, traces 30 can electrically connect to and overlie respective end surfaces 10A and extend away therefrom in a direction parallel to surface 28 in a redistribution layer 60. Traces 30 can be used to provide a wettable contact at a laterally offset position from the location of end surface 10A. In the embodiment shown in FIG. 8, multiple layers of traces 30 are formed within a redistribution dielectric 62 of redistribution layer 60; however, a single layer could be used to achieve a desired offset configuration. The layers of traces are separated from one another by portions of the redistribution dielectric 62 that extend between the traces 30 both in different layers and within the same layer. The traces 30 are connected, as desired, between layers using conductive vias 36, which are formed through portions of redistribution dielectric 60. An example of an array of pads 43 offset from end surfaces 10A in a redistribution layer 60 is shown in a schematic view in FIG. 3.

Figure 3:
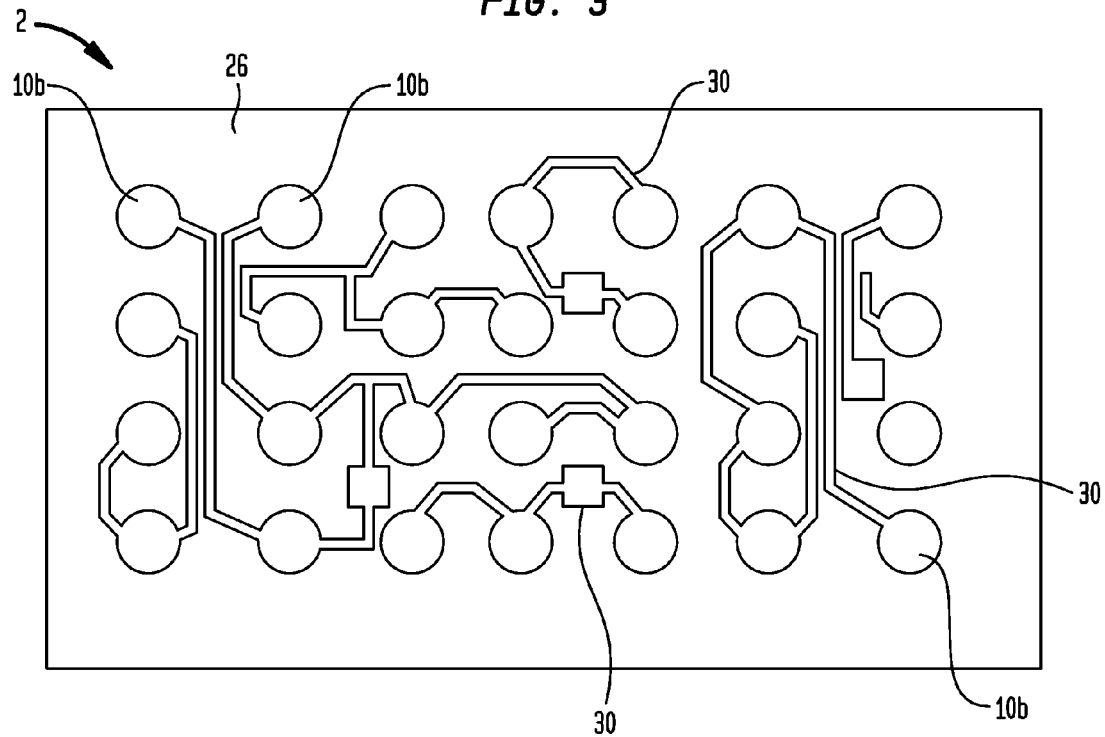
FIG. 3 is a top view of an interconnection component according to an embodiment of the present disclosure.

Traces 30 can have different widths, including widths which are smaller than the widths of end surfaces 10A and 10B of posts 10 (as shown in FIG. 3). This facilitates fabrication of an interconnection component having high routing density. Generally, the widths of traces 30 are selected in a range from about 5 to 100 μm (e.g., 20-40 μm); however, portions of traces (such as portions of traces 30 used as wettable contacts) or some traces, themselves, can have widths greater than 100 μm. Together with the posts 10, traces 30 can form an electrical circuit of interconnection component 2. Each trace 30 can be connected to at least one post 10 or to at least one other trace. However, some traces can "float", in that they can be electrically disconnected from posts and other traces. Likewise, one or more of the posts can remain unconnected to any traces.

An embodiment of interconnection component 2 having one or more redistribution layers 60 can allow interconnection component 2 to be used to connect to a microelectronic component having a different connection configuration than the configuration of posts 10. In particular, interconnection component 2 can be configured with a redistribution layer that gives an array of wettable contacts different pitches on either side of the component. As shown in FIG. 8, the pitch of end surfaces 10A used as wettable contacts formed by on surface 26 is greater than the pitch of the wettable contacts formed by vias 36 on surface 64 or redistribution layer 60. The embodiment shown in FIG. 9A is similar in this respect, in that the pitch of the wettable contacts that are the pads 34 on surface 26 is greater than the pitch of the wettable contacts that are pads 34 on outside surface 64.

As shown in FIGS. 10A and 10B, interconnect component 2 in either of the forms shown 9 and 10A, respectively, can be used to connect two components with respective contacts having different pitches or other different configurations. In the example shown in FIG. 10A microelectronic element 6 has contacts 50 having a smaller pitch than the pitch of contacts 52 on printed circuit board ("PCB") 12. Contacts 52 of PCB 12 are joined to end surfaces 10B, which act aw wettable contacts therefor, and contacts 50 of microelectronic element 50 are joined to vias pads 34 of interconnection component 2, which is inverted with respect to the depiction of FIG. 8. The embodiment shown in FIG. 10B is similar to that which is shown in 10A, except that pads 34 which overlie end surfaces 10B act as wettable contacts for attachment to contacts 52 of PCB 12 using solder balls 32.

Figure 9B:
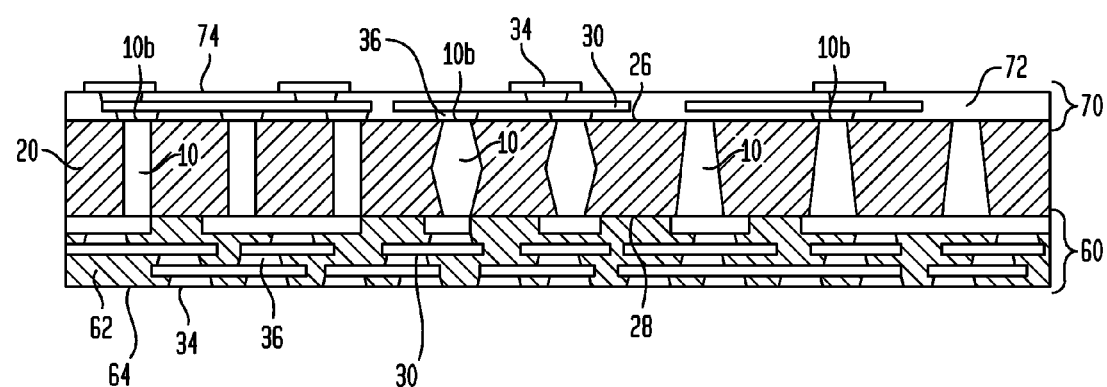

FIG. 9B shows an embodiment of interconnection component 2 having a second redistribution layer 70 formed along surface 26. Redistribution layer 70 is similar to redistribution layer 60, except that in the embodiment shown contacts 34 overlie portions of outside surface 74 and are electrically connected to conductive vias 36 that are uncovered by surface 74. Pads 34 are connected to respective ones of end surfaces 10B by traces 30 and additional conductive vias 36 formed within redistribution dielectric 72. Further, pads 34 are offset from their respective end surfaces 10B to be useable as wettable contacts on surface 74 a different configuration than end surfaces 10B. In the embodiment shown, the wettable contacts formed by pads 34 have a greater pitch than end surfaces 10B, and an even greater pitch than that of the contacts 34 on surface 64 that are useable as wettable contacts on surface 64. Such an arrangement can be used to form pitches for wettable contacts that differ between their respective surfaces by a factor of at least 1.5 and, in some embodiments at least about 2. It is noted that pads 32 can be formed overlying vias 36 on either surface 64 or 74. Alternatively, pads 34 can be connected directly to traces 30 either by a form of bonding or by being integrally formed therewith and exposed on either of surfaces 64 and 74. The embodiment of component 2 shown in FIG. 9B can be used in an assembly for attachment between a microelectronic element and a PCB in a similar arrangement as shown in FIGS. 10A and 10B, and can allow for an even greater difference in pitch between the conductive features of the microelectronic element and the PCB.

Microelectronic elements, or devices, can be mounted on the substrates using techniques such as a ball-bonding, as shown, or using other techniques. Similarly, such techniques may be used for connecting the substrates stacked on one another as additional components to the assemblies shown herein. Further examples of such assemblies are shown and described in U.S. Pat. No. 7,759,782 and in U.S. Pat. Application. Pub. No. 2010/0273293, the disclosures of which are hereby incorporated by reference herein in their entireties. For example, an interconnection component can be disposed on and connected to a PCB that includes an electrically conductive EMI shield. The end surfaces of the posts can then be solder bonded to contact pads of the PCB with the EMI shield being ball-bonded to a peripheral trace of the interconnection component for grounding to the shield Further, the interconnection components discussed herein can be interconnected to form multi-interposer assemblies. Such an assembly, can include two interconnect components that overlie each other. One of the stacked interconnect components can, for example, have a recess formed in the molded dielectric layer thereof to receive, without electronic connection to, a microelectronic package bonded to the other interconnect component.

As shown in FIG. 13, posts 10 can include edge surfaces 14 of various configurations. Edge surfaces 14A are shown as extending along substantially straight lines between the respective end surfaces 10A and 10B. Accordingly, edge surface 14A can form a substantially cylindrical shape along an axis extending between end surfaces 10A and 10B. Edge surfaces 14C extend between end surfaces 10A and 10B that are different in size such that edge surface 14C forms a substantially frustoconical shape. Alternatively, an edge surface similar to 14C extending between differently-sized bases can form a surface of revolution formed by a parabola.

Edge surface 14B is formed having a first portion 14Bi and a second portion 14Bii, such that the portion of edge surface 14B within first portion 14Bi slopes outwardly to face surface 28. The portion of edge surface 14B within second portion 14Bii slopes inwardly to face away from surface 28 such that the slope of edge surface 14B changes abruptly at a boundary formed between first portion 14Bi and second portion 14Bii. In an embodiment, this boundary forms ridge 15 in edge surface 14B, dividing first portion 14Bi from second portion 14Bii. Ridge 15, or another abrupt transition, can be located in any one of an infinite number of positions between respective end surfaces 10A and 10B, including near the halfway point therebetween or closer to either of end surface 10A or end surface 10B. By forming posts 10 with edge surfaces 14B, as described, an anchoring feature, such as ridge 15 is formed therein, which helps secure post 10 in position within dielectric layer 20. Examples of conductive projections, such as posts or pins, having anchoring features are shown and described in U.S. Patent Appln. Pub. No. 2008/0003402, the disclosure of which is incorporated herein in its entirety. Further examples are shown and described in U.S. patent application Ser. No. 12/838,974, the disclosure of which is incorporated herein in its entirety.

Figure 2:
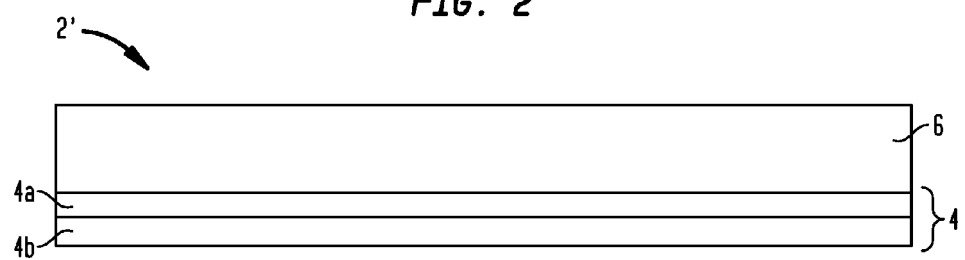
FIG. 2 is a side view of the structure shown in FIG. 1.
Figure 4:
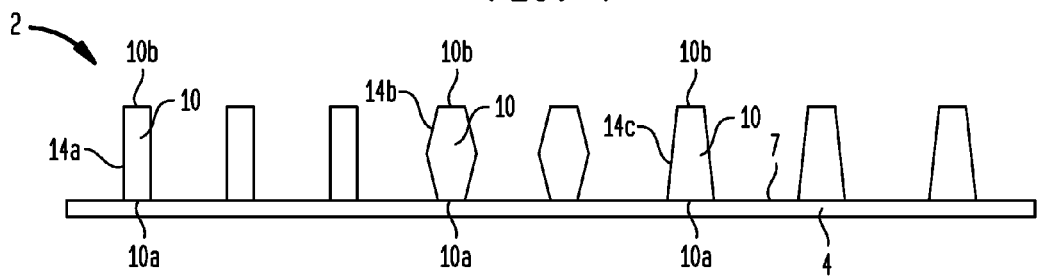
FIGS. 4 and 5 show an interconnection component according to an embodiment of the present disclosure during various steps of the fabrication thereof.

In a method for making interconnection component 2, as shown in FIG. 8, posts 10 can be formed on rigid metal layer 4. As shown in FIGS. 1-2, rigid metal layer can include two layers therein such as a conductive metal layer 4a and a barrier, or etch-stop, layer 4b. Alternatively, rigid metal layer 4 can be in the form of a carrier layer from with the in-process component 2' is later removed. Posts 10 can be monolithically formed such as by plating a conductive metal on an electrical commoning layer that can form part of rigid metal layer 4, or by etching posts 10 from a solid layer of metal 6 disposed on an etch-stop layer 4b, as shown in FIG. 2. In embodiments where posts 10 are formed by a process such as half-etching or the like, end surface 10A is considered to be present along a theoretical plane formed along the interface between posts 10 and surface 7 of layer 4. FIG. 4 shows posts 10 formed on a surface 7 on layer 4, extending away therefrom; however in other embodiments the surface 7 that posts 10 are referred to as extending away from can be included on any one of the aforementioned alternative structures. Layer 4, as shown in FIGS. 4-6 can represent any of these structures, including such multi-layer structures as shown in FIG. 2.

Figure 5:
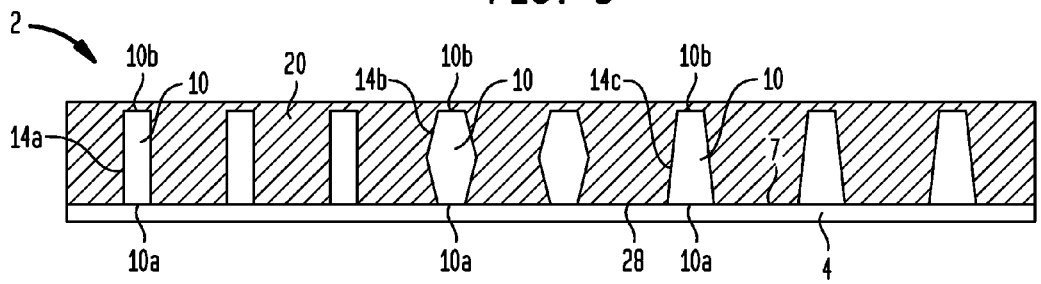
Figure 6A:
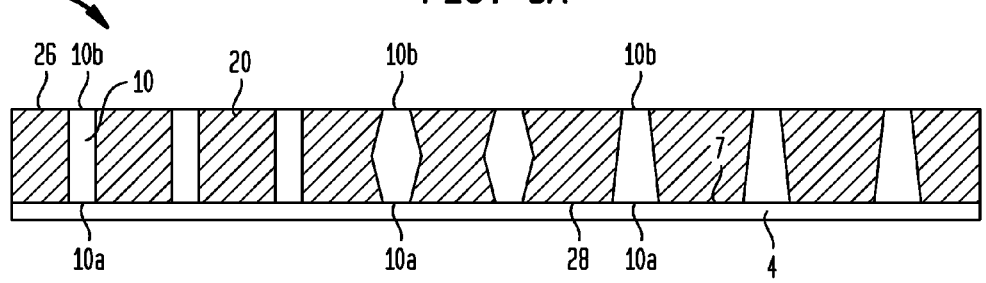
FIGS. 6A and 6B show variations in an interconnection component during alternative steps of a fabrication method according to embodiments of the present disclosure.

In FIG. 5, dielectric layer 20 is formed over edge surfaces 14 of posts 10A and over the portions of surface 7 between end surfaces 10B. In the molding process, a flowable composition is introduced in the desired locations and cured to form the dielectric layer. As previously discussed, the composition can be essentially any material which will cure to a solid form and form a dielectric and can further be a low-CTE curable material. During an exemplary embodiment of the molding processes, the in-process component 2 can be sandwiched between a press plate and a counter element which can be part of a molding tool. The counter element can be abutted against end surfaces 10B of the posts 10 and the flowable molding composition can be injected or otherwise introduced into the space between surface 7 and counter element.

The molding composition can be injected through at least one opening, or gate, in the counter element. Slots can further be used as escape passages for trapped air, and can also vent excess material of the molding composition. Upon completion of the molding process, the press plate and the counter element are removed. In some instances, the end surfaces 10B of the posts are free of molding composition at the completion of the molding step. In other instances, a thin film of molding composition can overlie end surfaces 10B of some or all of the posts 10. In such instances, the thin film can be removed by exposing surface 26 of the molded dielectric layer to a brief plasma etching or asking process which attacks the molded dielectric. Other processes that can be used for exposing tips 10B of posts 10 include grinding, lapping or polishing. In yet another variant, the dielectric material composition can be provided as a mass disposed on the end surfaces of posts or on the counter element before the counter element is engaged with the end surfaces of the posts, so that the composition is forced into the spaces between the posts as the posts are brought into abutment with the counter element.

In an alternative embodiment, the in-process component 2 can be a portion of a larger frame that incorporates a plurality of the similar structures for the formation of in-process components. In such an embodiment, the press plate and counter element of the molding tool are extended over the entire frame. Then, during the molding process, the molding composition is introduced simultaneously into the spaces between the components and counter element. After the press plate and counter element are removed upon completion of the molding process, the components can be separated (e.g., cut out) from the frame. Alternatively, such separation may occur after step the addition of pads or one or more redistribution layers.

The molding step can form the dielectric element, or dielectric layer, with a surface 26 coplanar with end surfaces 10B of the posts 2. The molding step can also form the dielectric layer with a surface 28 in engagement with the surface 7 and, thus, coplanar with end surfaces 10A of the posts 10.

Interconnection component 2 can be completed by forming one or more redistribution layers, such as redistribution layer 60 along surface 28 or redistribution layer 70 along surface 26, as shown in FIGS. 8 and 9B. The completion can also include the formation of pads 34 on any or surfaces 26, 28, 64, or 74, as described above and as shown in FIG. 9A, or as otherwise desired. Redistribution layer 60, for example, can be formed including traces 30 that are formed by etching away selected portions of layer 4 between the desired area for traces 30, as further described with respect to FIG. 7. Conductive traces 30 can be formed from the, for example layers 4a and 4b, using an etch process. At least a portion of redistribution dielectric 62 can then be applied along surface 28 between traces 30 and, optionally, over traces 30. This can form all or a part of redistribution layer 60. Further traces 30 and portions of redistribution dielectric 62 can then be formed along with conductive vias 36 to form a multilayer redistribution layer 60, as previously described.

Figure 6B:
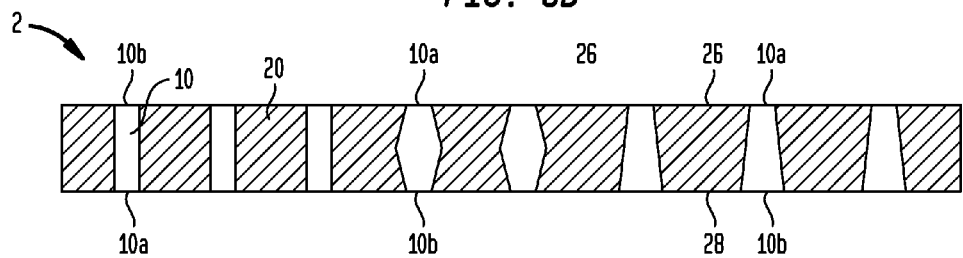
Figure 7:
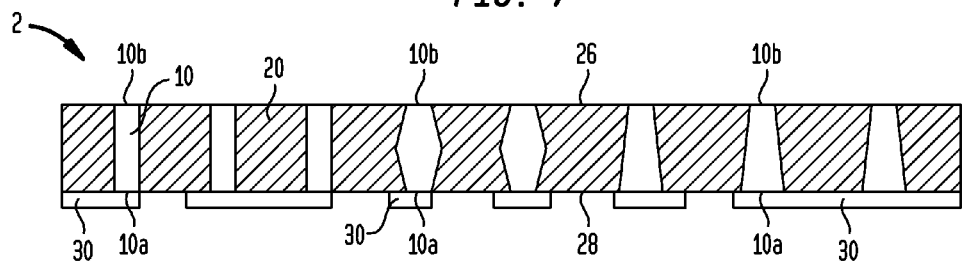
FIG. 7 shows a further step in a fabrication method according to an embodiment of the present disclosure.

Alternatively, such as in an embodiment where pins are formed on a non-conductive carrier or the like, the carrier can be removed, exposing surface 28 and resulting in the structure of FIG. 6B. Traces 30 can then be formed on surface 28 such as by patterning traces 30 directly. Alternatively, traces 30 can be formed by plating or bonding a separate metal layer to end surfaces 10A and extending along surface 28 and then by etching the layer to remove the area between traces 30. This process can be continued as described above, to form a multilayer redistribution layer. As a further alternative, a redistribution layer having traces 30 embedded in a redistribution dielectric can be formed separately and joined to either of end surfaces 10A or 10B and along the respective surfaces 28 and 26.

In a further embodiment pins can be fabricated from a single layer of the principal metal (e.g., Cu and the like). Pins 10 can be formed from the metal using an etch process or a plating process. The dielectric layer 20 can then be formed using the process described above in reference to FIG. 5. Then, conductive traces 30 can be formed from the remaining metal of the layer opposite the posts 10 using an etch process.

The in-process component can be completed according to the various methods described above.

Figure 11:
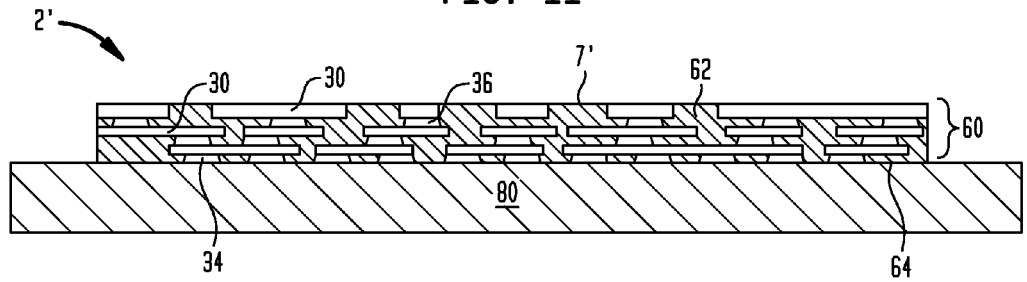
FIGS. 11-13 show an interconnection component during steps of an alternative fabrication process.
Figure 12:
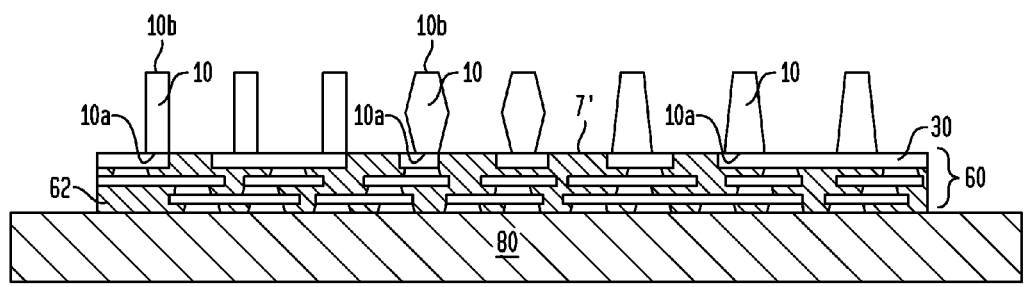

An alternative method for forming an interconnection component 2 is shown in FIGS. 11-13. In FIG. 11, a redistribution layer 60 is shown formed on a carrier 80. In FIG. 12 posts 10 are then formed by plating or by etching, as described above, such that end surfaces 10A overlie selected portions of traces 30 that are connected to corresponding offset wettable surfaces, which can be for example, pads 34 uncovered by redistribution dielectric 62. In FIG. 13, dielectric layer 20 is formed over the surface 7' of redistribution layer 30 between posts 10 and along edge surfaces 14 of posts 10. The interconnection component 2 can then be removed from carrier 80 or a second dielectric layer 70 or pads 32 can be formed on surface 26 prior to removal from carrier 80.

Figure 14:
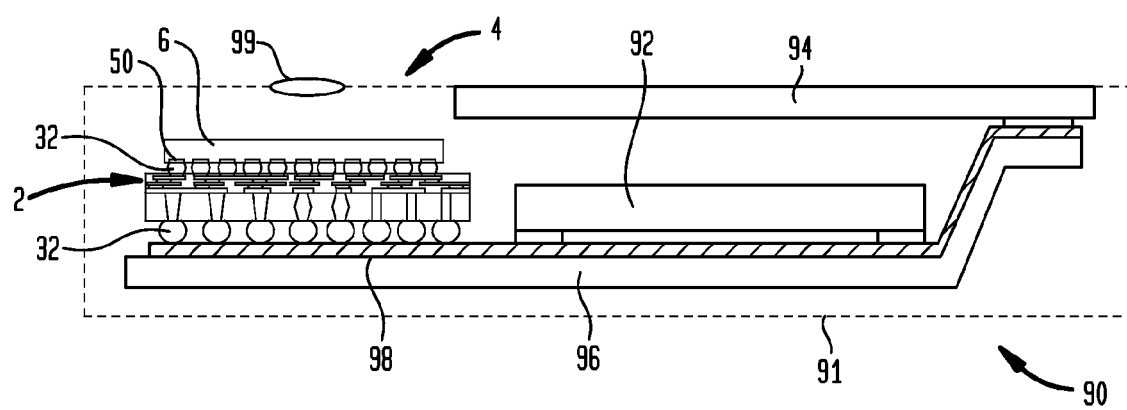
FIG. 14 shows an electronic system that can include a microelectronic assembly as shown in FIGS. 10A and 10B.

The interconnection components described above can be utilized in construction of diverse electronic systems, as shown in FIG. 14. For example, a system 90 in accordance with a further embodiment of the invention can include a microelectronic assembly 4, being a unit formed by assembly of a microelectronic element 6 with an interconnection component 2, similar to the microelectronic assembly 4 of a microelectronic element 6 and interconnection component 2 as shown in FIG. 10A. The embodiment shown, as well as other variations of the interconnection component or assemblies thereof, as described above can be used in conjunction with other electronic components 92 and 94. In the example depicted, component 92 can be a semiconductor chip or package or other assembly including a semiconductor chip, whereas component 94 is a display screen, but any other components can be used. Of course, although only two additional components are depicted in FIG. 14 for clarity of illustration, the system may include any number of such components. In a further variant, any number of microelectronic assemblies including a microelectronic element and an interconnection component can be used. The microelectronic assembly and components 92 and 94 are mounted in a common housing 91, schematically depicted in broken lines, and are electrically interconnected with one another as necessary to form the desired circuit. In the exemplary system shown, the system includes a circuit panel 96 such as a flexible printed circuit board, and the circuit panel includes numerous conductors 98, of which only one is depicted in FIG. 14, interconnecting the components with one another. However, this is merely exemplary; any suitable structure for making electrical connections can be used, including a number of traces that can be connected to or integral with contact pads or the like. Further, circuit panel 96 can be of a similar structure to PCB having contacts 52 thereon, and can connect to interconnection component 2 using solder balls 32 or the like. The housing 91 is depicted as a portable housing of the type usable, for example, in a cellular telephone or personal digital assistant, and screen 94 is exposed at the surface of the housing. Where structure 90 includes a light-sensitive element such as an imaging chip, a lens 99 or other optical device also may be provided for routing light to the structure. Again, the simplified system 90 shown in FIG. 14 is merely exemplary; other systems, including systems commonly regarded as fixed structures, such as desktop computers, routers and the like, can be made using the structures discussed above.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

The invention claimed is:

1. A method for making an interconnection component, comprising:
    providing an element having a plurality of substantially rigid solid metal posts extending away from a reference surface, each post having a first and a second opposed end surface and an edge surface extending between the first and second end surfaces, each post having a single monolithic metal region throughout and at the edge surface;
    then forming a dielectric layer having a coefficient of thermal expansion of less than 8 parts per million per degree Celsius (ppm/° C.) contacting the edge surfaces and filling spaces between adjacent ones of the posts, the dielectric layer having first and second outermost opposed surfaces which are coplanar with the first and second end surfaces, respectively; and
    completing the interconnection component, the interconnection component having no electrically conductive interconnects between the first and second end surfaces of the posts that extend in a lateral direction between the posts, the interconnection component having first and second pluralities of wettable contacts adjacent the first and second opposed surfaces, respectively, the first and second wettable contacts being usable to bond the interconnection component to at least one of a microelectronic element or a circuit panel, at least one of the first wettable contacts or the second wettable contacts configured for bonding to element contacts on a face of a microelectronic element and at least one of the first wettable contacts or the second wettable contacts configured for bonding to circuit contacts on a face of a circuit panel.

2. The method of claim 1, wherein at least some of the wettable contacts are defined by the first end surfaces or the second end surfaces.

3. The method of claim 1, wherein the step of forming the dielectric layer further includes removing a portion of the dielectric layer to uncover at least one of the first end surfaces or second end surfaces of the posts.

4. The method of claim 1, wherein the first dielectric layer is formed from a material selected from the group consisting of: low temperature co-fired ceramic, liquid crystal polymer, glass, and high filler content epoxy.

5. The method of claim 1, wherein the plurality of posts are formed from at least one of the group consisting of: gold, copper, copper alloy, aluminum, and nickel.

6. The method of claim 1, wherein the first dielectric layer has a thickness of at least 10 µm between the first and second surfaces.

7. The method of claim 1, wherein the step of completing the interconnection component includes forming conductive elements, including at least some of the second wettable contacts in electrical connection with the second end surfaces, wherein at least some of the second wettable contacts are offset along the second surface of the dielectric layer from the connected second end surfaces.

8. The method of claim 7, wherein the first wettable contacts define a first pitch and wherein the second wettable contacts define a second pitch that is different from the first pitch.

9. The method of claim 7, wherein the dielectric layer is a first dielectric layer, and the step of completing the interconnection component includes forming a second dielectric layer along the second outermost surface of the first dielectric layer, the second dielectric layer having a surface on which at least some of the second wettable contacts are, wherein the second wettable contacts are electrically connected with the second end surfaces through first traces extending along the second dielectric layer.

10. The method of claim 9, wherein the step of completing the interconnection component includes forming a third dielectric layer along the first outermost surface of the first dielectric layer, the third dielectric layer having a surface on which at least some of the first wettable contacts are, wherein the first wettable contacts are electrically connected with the first end surfaces through second traces extending along the third dielectric layer.

11. The method of claim 1, wherein the step of providing the element includes forming the posts on a metal layer that defines the reference surface, the step of completing the interconnection component further including selectively removing portions of the metal layer to form a plurality of traces extending from the posts at the first end surfaces.

12. The method of claim 11, wherein the forming of the posts includes plating the posts along selected areas of the metal layer.

13. The method of claim 1, wherein the step of providing the element includes forming the posts by etching a metal layer to remove metal from areas outside the posts, so as to leave a thinned portion thereof, the step of completing the interconnection component further including selectively removing portions of the thinned portion of the metal layer to form a plurality of traces extending from the posts at the first end surfaces.

14. The method of claim 11, wherein the step of selectively removing portions of the metal layer forms at least some of the traces extending between at least some of the posts at the first end surfaces.

15. The method of claim 1, wherein the reference surface is defined by an inside surface of a redistribution dielectric, the redistribution dielectric having an outside surface on which at least some of the first wettable contacts are, wherein the first wettable contacts are electrically connected with the second end surfaces through first traces extending along the redistribution dielectric.

16. A method for making a microelectronic assembly, including:
mounting a interconnection component made according to claim 1 to a substrate having a plurality of first contacts thereon such that at least some of the first wettable contacts are electrically connected with the first contacts; and
mounting a microelectronic element having a plurality of second contacts at a face thereof to the interconnection component such that at least some of the second contacts are electrically connected with the second wettable contacts of the interconnection component.

17. The method of claim 16, wherein the step of mounting the microelectronic element includes joining the second contacts with the second wettable contacts through masses of conductive bonding material.

18. The method of claim 17, wherein the step of mounting the interconnection component with the substrate includes joining the first contacts with the first wettable contacts through masses of conductive bonding material.

19. A method for making a microelectronic interconnection component, comprising:
forming a redistribution layer on a carrier, the redistribution layer including a redistribution dielectric having a first surface on the carrier and a second surface remote therefrom, a plurality of conductive first connection elements uncovered by the redistribution dielectric at the first surface, and a plurality of conductive traces extending along the redistribution dielectric having portions thereof uncovered by the redistribution dielectric at the second surface thereof;
forming a plurality of substantially rigid solid metal posts from at least one of the group consisting of: gold, copper, copper alloy, aluminum, and nickel, each post extending away from the redistribution layer, each of the posts including a base having a first end surface, at least some of the posts being electrically connected with respective traces of the redistribution layer, the posts having a second end surface remote from the first end surface, and edge surfaces extending between the first and second end surfaces; and then
forming a dielectric layer overlying the redistribution layer and filling spaces between the posts so that a first outermost surface and an opposed second outermost surface of the dielectric layer are coplanar with respective first and second opposed end surfaces of the rigid solid metal posts, and the interconnection component having a plurality of wettable contacts at a surface of the dielectric layer, the wettable contacts being usable to bond the interconnection component to at least one of a microelectronic element or a circuit panel, and wherein the interconnection component does not have any interconnects between the first and second end surfaces of the posts that extend in a lateral direction.

20. A method for making an interconnection component, comprising:
providing an element having a plurality of substantially rigid solid metal posts extending away from a reference surface, each post having a first and a second opposed end surface and an edge surface extending between the first and second end surfaces, each post having a single monolithic metal region throughout and at the edge surface;
then forming a dielectric layer having a coefficient of thermal expansion of less than 8 parts per million per degree Celsius (ppm/° C.) contacting the edge surfaces and filling spaces between adjacent ones of the posts, the dielectric layer having first and second outermost opposed surfaces which are coplanar with the first and second end surfaces, respectively, wherein the first dielectric layer has a thickness of at least 10 µm between the first and second surfaces; and
completing the interconnection component, the interconnection component having no electrically conductive interconnects between the first and second end surfaces of the posts that extend in a lateral direction between the posts, the interconnection component having first and second pluralities of wettable contacts adjacent the first and second opposed surfaces, respectively, the first and second wettable contacts being usable to bond the interconnection component to at least one of a microelectronic element or a circuit panel, at least one of the first wettable contacts or the second wettable contacts configured for bonding to element contacts on a face of a microelectronic element and at least one of the first wettable contacts or the second wettable contacts configured for bonding to circuit contacts on a face of a circuit panel, wherein the plurality of posts are formed from at least one of the group consisting of: gold, copper, copper alloy, aluminum, and nickel.

* * * * *